(12) United States Patent
Jurgensen et al.

(10) Patent No.: US 7,128,786 B2
(45) Date of Patent: Oct. 31, 2006

(54) PROCESS FOR DEPOSITING III-V SEMICONDUCTOR LAYERS ON A NON-III-V SUBSTRATE

(75) Inventors: Holger Jurgensen, Aachen (DE); Alois Krost, Berlin (DE); Armin Dadgar, Berlin (DE)

(73) Assignee: Aixtron AG (DE)

( * ) Notice: Subject to any disclaimer, the term of this patent is extended or adjusted under 35 U.S.C. 154(b) by 62 days.

(21) Appl. No.: 10/872,914

(22) Filed: Jun. 21, 2004

(65) Prior Publication Data

US 2005/0022725 A1 Feb. 3, 2005

Related U.S. Application Data

(63) Continuation of application No. PCT/EP02/14096, filed on Dec. 11, 2002.

(51) Int. Cl.
*C30B 25/04* (2006.01)

(52) U.S. Cl. .............................. 117/95; 117/84; 117/88; 117/89; 117/90; 117/94; 117/97; 117/106; 117/952

(58) Field of Classification Search ................. 117/95, 117/84, 88, 89, 90, 94, 97, 106, 952
See application file for complete search history.

(56) References Cited

U.S. PATENT DOCUMENTS

| | | | | |
|---|---|---|---|---|
| 6,153,010 | A * | 11/2000 | Kiyoku et al. | 117/95 |
| 6,160,833 | A * | 12/2000 | Floyd et al. | 372/96 |
| 6,183,555 | B1 * | 2/2001 | Shibata et al. | 117/98 |
| 6,325,850 | B1 * | 12/2001 | Beaumont et al. | 117/95 |
| 6,468,347 | B1 * | 10/2002 | Motoki et al. | 117/89 |
| 6,570,192 | B1 * | 5/2003 | Davis et al. | 257/103 |
| 6,802,902 | B1 * | 10/2004 | Beaumont et al. | 117/95 |
| 6,841,808 | B1 * | 1/2005 | Shibata et al. | 257/190 |

OTHER PUBLICATIONS

Applied Physics Letters, vol. 71, No. 17, Oct. 27, 1997, Zheleva et al., Dislocation density reduction via lateral epitaxy in selectively grown GaN structures, 3 pages.
Applied Physics Letters, vol. 75, No. 14, Oct. 4, 1999, Chen et al., Dislocation reduction in GaN thin films via lateral overgrowth from trenches, 2 pages.
Applied Physics Letters, vol. 78, No. 6, Feb. 5, 2001, Strittmatter et al., Maskless epitaxial lateral overgrowth of GaN layers on structured Si(111) substrates, 3 pages.

* cited by examiner

*Primary Examiner*—Yogendra N. Gupta
*Assistant Examiner*—Matt J Song
(74) *Attorney, Agent, or Firm*—St. Onge Steward Johnston & Reens LLC

(57) ABSTRACT

This invention relates to a method for depositing III-V semiconductor layers on a non III-V substrate especially a sapphire, silicon or silicon oxide substrate, or another substrate containing silicon. According to said method, a III-V layer, especially a buffer layer, is deposited on the substrate or on a III-V germination layer, in a process chamber of a reactor containing gaseous starting materials. In order to reduce the defect density of the overgrowth, a masking layer consisting of essentially amorphous material is deposited directly on the III-V germination layer or directly on the substrate, said masking layer partially covering of approximately partially covering the germination layer. The masking layer can be a quasi-monolayer and can consist of various materials.

20 Claims, 1 Drawing Sheet

PROCESS FOR DEPOSITING III-V SEMICONDUCTOR LAYERS ON A NON-III-V SUBSTRATE

Figure 1:
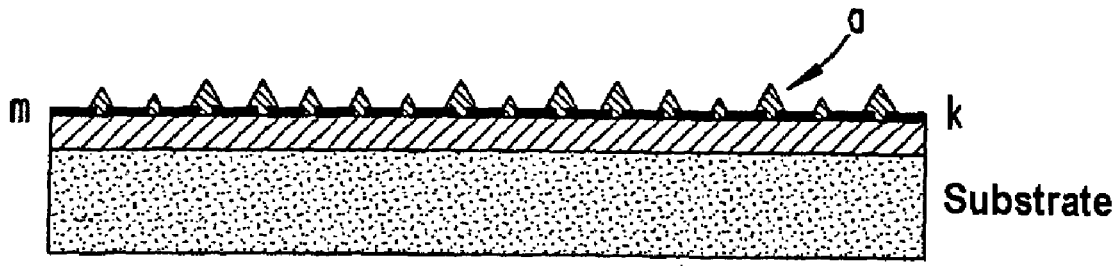

This application is a continuation of pending International Patent Application No. PCT/EP02/14096 filed Dec. 11, 2002 which designates the United States and claims priority of pending German Patent Application Nos. 101 63 715.2 filed Dec. 21, 2001 and 102 06 751.1 filed Feb. 19, 2002.

The invention relates to a process for depositing III-V semiconductor layers on a non-III-V substrate, in particular a sapphire, silicon, silicon oxide substrate or some other form of silicon-containing substrate, in which a III-V layer, in particular a buffer layer, is deposited on a III-V seed layer in a process chamber of a reactor from gaseous starting substances.

The epitaxial growth of group III-group V semiconductors on foreign substrates is currently desirable for cost reasons, for example because silicon substrates are significantly less expensive than III-V substrates and in particular gallium arsenide substrates and because the possibility of integration with the remaining silicon electronics is desirable. The deposition of III-V semiconductors, for example gallium arsenide or indium phosphide or solid solutions thereof, on account of the lattice mismatch which is generally present, leads to a high defect density in the grown layer. According to the invention, the deposition of the gallium arsenide or indium phosphide layer is carried out using the MOCVD process, in which gaseous starting substances, for example TMG, TMI, TMAI, arsine or phosphine NH3are introduced into the process chamber of a reactor, where the silicon substrate is resting on a heated substrate holder.

The object of the invention is to provide a process which allows the defect density of the grown layer to be reduced.

The object is achieved by the invention given in the claims, in which according to Claim 1, a masking layer which incompletely or virtually incompletely covers the seed layer and substantially comprises amorphous material is deposited directly on the III-V seed layer. As far as possible, this material should still have the property of repelling III-V growth. According to the invention, the masking layer is deposited as a quasi-monolayer. This results in the formation of a quasi-monolayer. The masking layer preferably consists of a different semiconductor material from the seed layer or the layer deposited thereon, for example the buffer layer. The masking layer may consist of $Si_xN_y$ or $SiO_x$. However, it may also consist of metal. On account of the deposition of this masking layer on the seed layer, which is generally less than 100 nm thick, the seed layer is covered apart from randomly distributed island regions. After the masking layer has been deposited, therefore, a very thin layer, on which no III-V material grows, is formed on the III-V seed layer or the substrate. The majority of the surface is masked. However, this layer or mask is not continuous, but rather forms free spaces in island form in which there is an uncovered III-V surface of the seed layer. These island-like III-V surface sections form seed zones for the III-V buffer layer which is then to be deposited. After the seed layer has been deposited, the buffer layer is deposited from one or more gaseous III materials and one or more gaseous V materials. The seed growth initially takes place only in the region of the uncovered III-V surfaces, i.e. at the islands, at locations which are remote from one another. The growth parameters for this layer (buffer layer) are initially selected to be such that substantially lateral growth takes place. Accordingly, the seeds initially grow toward one another, until a substantially continuous layer has formed. This process produces regions with a very low defect density over a large area. After a continuous surface has been formed, the growth parameters can be modified in such a manner that the growth takes place predominantly in the vertical direction.

Figure 2:
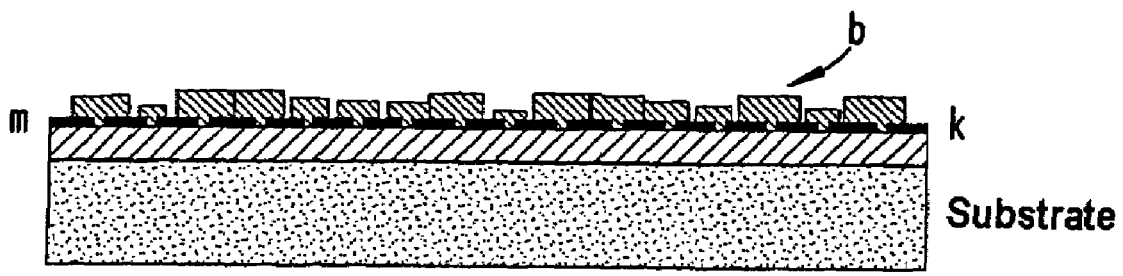

In the appended FIG. 1, a seed layer of, for example gallium arsenide, aluminum nitride, aluminum gallium nitride, gallium aluminum arsenide or the like, which is denoted by k, has been deposited on the silicon substrate. Then, in the manner described above, a masking layer of, for example, silicon nitride or silicon oxide is deposited on this seed layer k. This can be effected by a silicon-containing gas and a nitrogen-containing gas or an oxygen-containing gas being introduced into the process chamber. Suitable masking layers are in principle any layer on which further seeding of the III-V material during the subsequent deposition of the buffer layer is suppressed. The deposition of the actual buffer layer on the masked seed layer then takes place. This is illustrated in FIG. 2. There, the growth initially takes place only in the lateral direction. The individual islands increase in size toward one another. Lateral growth is boosted. This allows the nuclei to coalesce rapidly. Moreover, depending on the type of crystal, it is also possible, for example by means of oblique facets, for dislocations to be diverted preferably into the lateral direction. New dislocations are then formed only in the coalescence regions of the laterally growing layers. Therefore, for a low defect density a great distance between the crystal seeds or locations in the masks which remain open is desirable. This distance may amount to a few μm.

Figure 3:
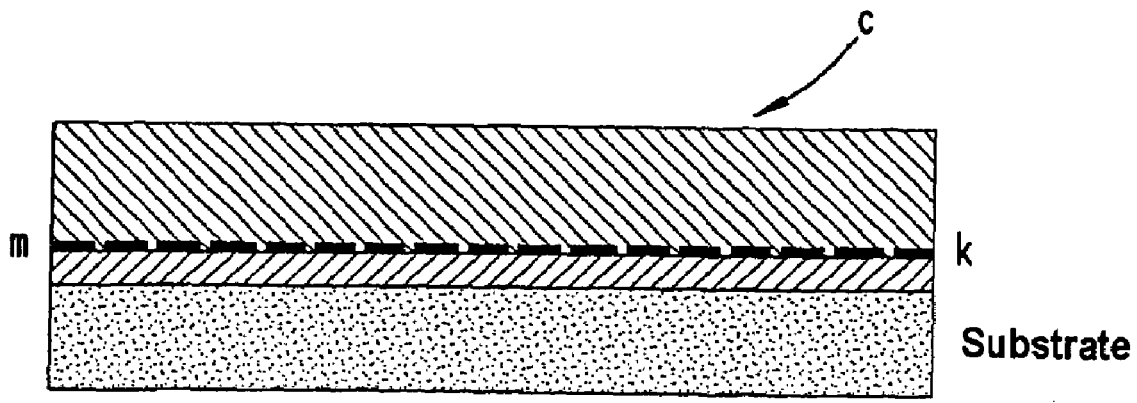

FIG. 3 shows the complete III-V layer, denoted by c.

The seed layer itself is used for uniform seeding of the substrate and, in the case of nonpolar substrates, for orientation of the crystal growing thereon. Therefore, when insulating sapphire is used as the substrate, this is not required and in this case an $Si_xN_y$ mask deposited in situ directly on the substrate can also be used to improve the crystallographic properties. A masking of this type cannot be controlled in the case of silicon-containing substrates, such as SiC or SiGe layers and in particular in the case of pure silicon, since the substrate is completely nitrided or oxidized too quickly and the seed layer is required in order to predetermine the polarity.

To achieve uniform seeding, the seeding can also be carried out at lower temperatures than the subsequent growth temperatures and/or using starting substances, such as, for example aluminum, which have a lower mobility. In this way, it is possible to avoid generally undesirable insular growth of the seed layer and to predetermine the polarity or orientation for the subsequent layer growth. Moreover, in the case of III nitride layers, aluminum-containing seed layers are particularly suitable in order to improve the crystal orientation.

A variant of the invention provides for a plurality of masking layers to be deposited within the buffer layer. In this case too, the masking layer is applied in situ, i.e. immediately after the application of a III-V layer in the same process chamber, without the substrate being covered or removed from the process chamber. The layers can be produced in various ways. For example, to produce a masking layer it is possible simply to introduce oxygen into the process chamber. This gives rise to oxide formation. This is particularly advantageous if the III-V layer contains aluminum. In this case, an aluminum oxide masking layer is formed. It is also possible to deposit silicon together with oxygen. Metallic masks can also be used. By way of example, tungsten is suitable.

An amorphous masking layer has the effect of interrupting the crystal periodicity. The masking layer can also be produced by degradation of the semiconductor surface, for example at high temperatures. The openings in the masking layers may be at a distance of from several hundred nanometers to a few micrometers apart. Since the growth originates from the openings, the layers above the masks grow in single-crystal form until the individual seeds meet. In this case, the seeds grow virtually without dislocations as far as the coalescence locations, where dislocations may be formed.

There is provision for a mask to be deposited on a first region of a buffer layer. This buffer layer section then acts to a certain extent as a seed layer for a III-V semiconductor layer to be deposited thereon. This layer sequence can be repeated numerous times, which overall leads to a reduction in the dislocation density. Then too, the process is carried out in such a way that each time a masking layer has been deposited the process parameters are set in such a way that initially lateral growth takes place preferentially, so that the voids are closed up.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. Process for depositing III-V semiconductor layers on a non-III-V substrate, in particular a sapphire, silicon, silicon oxide substrate or some other form of silicon-containing substrate, in which a III-V layer, in particular a buffer layer, is deposited on the substrate or on a III-V seed layer in a process chamber of a reactor from gaseous starting substances, characterized in that a masking layer is a quasi-monolayer comprising randomly distributed mask zones that incompletely covers the seed layer and substantially comprises amorphous material is deposited directly on the III-V seed layer or directly on the substrate.

2. Process according to claim 1, characterized in that the masking layer consists of a different semiconductor material from the seed layer or the buffer layer.

3. Process according to claim 1, characterized in that the masking layer is $Si_xN_y$ or $SiO_x$.

4. Process according to claim 1, characterized in that the masking layer is a metal.

5. Process according to claim 1, characterized in that the growth parameters of the buffer layer are initially set for enhanced lateral growth until a continuous layer is formed.

6. Process according to claim 1, characterized in that the seed layer is thinner than 100 nm.

7. Process according to claim 1, characterized in that a multiplicity of masking layers are deposited in the III-V buffer layer.

8. Process according to claim 1, characterized in that buffer layer sections and masking layers are deposited cyclically.

9. Process according to claim 1, characterized in that the masking layer has a surface which repels the deposition of a III-V layer.

10. Process according to claim 1, characterized in that the seed layer and/or the buffer layer contains aluminum and the masking layer is generated by the introduction of oxygen.

11. Process according to claim 1, characterized in that the deposition process is an MOCVD process, a CVD process or an in-situ sequence of these processes.

12. Process according to claim 1, characterized in that the deposition involves a VPE or MBE process.

13. Process according to claim 1, characterized in that component layer sequences are deposited on the buffer layer.

14. Process according to claim 1, characterized in that components are fabricated from the component layer sequences.

15. A method for depositing III-V semiconductor layers on a non-III-V substrate in which a III-V buffer layer is deposited on the substrate or on a III-V seed layer in a process chamber of a reactor from gaseous starting substances, the method comprising:

creating a non-continuous masking layer that partially covers the substrate or III-V seed layer by depositing a non-continuous monolayer on the substrate or III-V seed layer such that the substrate or III-V seed layer is substantially covered by the monolayer and includes uncovered zones corresponding to island-like spaces in the monolayer;

depositing the III-V buffer layer on the non-continuous masking layer so that the buffer layer is deposited on the substrate or III-V seed layer in the uncovered zones corresponding to the island-like spaces in the monolayer.

16. The method according to claim 15, wherein the masking layer consists of a different semiconductor material from the seed layer or the buffer layer.

17. The method according to claim 15, further comprising setting the growth parameters of the buffer layer for enhanced lateral growth until a continuous layer is formed.

18. The method according to claim 15, further comprising:

depositing an additional non-continuous masking layer on the buffer layer; and depositing an additional buffer layer on the additional non-continuous masking layer.

19. The method according to claim 15, wherein the masking layer has a surface which repels the deposition of a III-V layer.

20. The method according to claim 15, wherein the seed layer is thinner than 100 nm.

* * * * *